United States Patent
Kasuga

(10) Patent No.: US 9,167,701 B2
(45) Date of Patent: Oct. 20, 2015

(54) METHOD OF MOUNTING ELECTRONIC COMPONENT

(71) Applicant: YAMAHA HATSUDOKI KABUSHIKI KAISHA, Shizuoka-ken (JP)

(72) Inventor: Daisuke Kasuga, Shizuoka (JP)

(73) Assignee: Yamaha Hatsudoki Kabushiki Kaisha, Shizuoka-ken (JP)

( * ) Notice: Subject to any disclaimer, the term of this patent is extended or adjusted under 35 U.S.C. 154(b) by 132 days.

(21) Appl. No.: 13/951,318

(22) Filed: Jul. 25, 2013

(65) Prior Publication Data

US 2014/0150254 A1    Jun. 5, 2014

(30) Foreign Application Priority Data

Dec. 5, 2012 (JP) .................................. 2012-266190

(51) Int. Cl.
| | |
|---|---|
| H05K 3/30 | (2006.01) |
| H05K 13/02 | (2006.01) |
| H05K 13/04 | (2006.01) |
| H05K 13/08 | (2006.01) |

(52) U.S. Cl.
CPC ............. *H05K 3/303* (2013.01); *H05K 13/021* (2013.01); *H05K 13/0417* (2013.01); *H05K 13/08* (2013.01); *Y10T 29/4913* (2015.01); *Y10T 29/53174* (2015.01)

(58) Field of Classification Search
CPC ..... H05K 13/08; H05K 13/021; H05K 13/02; H05K 13/0069; H05K 13/0015; H05K 13/0061; Y10T 29/53174; Y10T 29/4913; Y10T 29/49131; Y10T 29/53052; Y10T 29/53261; Y10T 29/53265

USPC .......... 29/832, 720, 739, 740, 743, 833, 834, 29/836; 414/416.05, 730

See application file for complete search history.

(56) References Cited

U.S. PATENT DOCUMENTS 7,712,208 B2* 5/2010 Watanabe et al. ............... 29/740
8,091,215 B2* 1/2012 Tsukagoshi ..................... 29/740

FOREIGN PATENT DOCUMENTS

| | | |
|---|---|---|
| JP | H03-29400 A | 2/1991 |
| JP | 2005-235952 A | 9/2005 |
| JP | 2008-198914 A | 8/2008 |
| WO | 00/16602 A1 | 3/2000 |

OTHER PUBLICATIONS

The extended European search report issued by the European Patent Office on Jun. 30, 2014, which corresponds to EP13003635.3-1803 and is related to U.S. Appl. No. 13/951,318.

* cited by examiner

*Primary Examiner* — Thiem Phan
(74) *Attorney, Agent, or Firm* — Studebaker & Brackett PC

(57) ABSTRACT

An electronic component mounting method includes a removing step, a first mounting step, a first attaching step and a second mounting step. In the removing step, a first feeder holding first electronic components is removed from an attaching portion of a component feeding device when there is a reason for removing the first feeder from the attaching portion. In the first mounting step, electronic components other than the first electronic component, out of electronic components to be mounted on a board, are mounted on the board when the first feeder is removed from the attaching portion. In the first attaching step, the first feeder is attached to another attaching portion, to which no feeder is attached, after the removing step. In the second mounting step, the first electronic component is mounted on the board from the first feeder attached to the other attaching portion after the first attaching step.

4 Claims, 14 Drawing Sheets

METHOD OF MOUNTING ELECTRONIC COMPONENT

BACKGROUND OF THE INVENTION

1. Field of the Invention

The present disclosure relates to a surface mounting apparatus for mounting electronic components on a printed circuit board and an electronic component mounting method using the same.

2. Description of the Background Art

Conventionally, there is known a surface mounting apparatus for mounting electronic components on a printed circuit board. Such a surface mounting apparatus includes a component feeding device, to which a plurality of tape feeders (hereinafter, referred to merely as feeders) for feeding electronic components are attached, in some cases. A board production method for efficiently mounting electronic components from the component feeding device in such a surface mounting apparatus is disclosed, for example, in Japanese Unexamined Patent Publication No. 2008-198914.

In an operation of mounting electronic components by the surface mounting apparatus as described above, electronic components may run out in each feeder attached to the component feeding device. If the electronic components run out in the feeder, they cannot be mounted on printed circuit boards. Thus, the mounting operation by the surface mounting apparatus is stopped in some cases.

SUMMARY OF THE INVENTION

An object of the present disclosure is to provide a technology capable of avoiding the stop of a surface mounting apparatus due to shortage.

An electronic component mounting method according to one aspect of the present invention that achieves this object is a method for mounting electronic components using a surface mounting apparatus including a base, a plurality of feeders holding a plurality of electronic components, a component feeding device with a plurality of attaching portions to which the feeders are to be mounted, a transport device for conveying a board onto the base, and a component mounting device for mounting the electronic components on the board conveyed onto the base from the feeders attached to the component feeding device.

The above electronic component mounting method includes:

a removing step of removing a first feeder holding first electronic components, out of the electronic components held by a respective plurality of the feeders attached to the component feeding device, from the attaching portion when there is a reason for removing the first feeder from the attaching portion;

a first mounting step of mounting the electronic components other than the first electronic component, out of the electronic components to be mounted on the board, on the board by the component mounting device when the first feeder is removed from the attaching portion;

a first attaching step of attaching the first feeder to another attaching portion, to which no feeder is attached, after the removing step; and a second mounting step of mounting the first electronic component on the board from the first feeder attached to the other attaching portion by the component mounting device after the first attaching step.

Further, a surface mounting apparatus according to another aspect of the present invention includes:

a base;

a plurality of feeders holding a plurality of electronic components;

a component feeding device with a plurality of attaching portions to which the feeders are to be mounted;

a transport device for conveying a board onto the base;

a component mounting device for mounting the electronic components on the board conveyed onto the base from the feeders attached to the component feeding device;

a control device for controlling the drive of the component mounting device; and a display device;

wherein:

the component feeding device detects the attachment of the feeder and transmits position information of the corresponding attaching portion to the control device when the feeder is attached to the attaching portion of the component feeding device and detects the removal of the feeder and transmits position information of the corresponding attaching portion to the control device when any of the feeder is removed from the attaching portion of the component feeding device;

the control device:

causes the display device to show each of a first display indicating the position of the attaching portion, to which a first feeder holding first electronic components out of the electronic components respectively held by a plurality of the feeders attached to the attaching portions of the component feeding device is attached, out of the plurality of attaching portions, a second display instructing the removal of the first feeder from the attaching portion and a third display designating the position of another attaching portion to which the first feeder removed from the attaching portion is to be reattached when there is a reason for removing the first feeder from the attaching portion, causes the component mounting device to mount the electronic components other than the first electronic component on the board when the removal of the first feeder from the attaching portion is detected by the component feeding device, causes the component mounting device to mount the first electronic component on the board from the first feeder attached to the other attaching portion when the reattachment of the first feeder to the other attaching portion is detected by the component feeding device, and causes the component mounting device to mount the first electronic component on the board from a second feeder holding the first electronic components on the condition that the remaining number of the first electronic components held by the first feeder attached to the other attaching portion becomes 0 when the attachment of the second feeder to the attaching portion is detected by the component feeding device.

These and other objects, features and advantages of the present disclosure will become more apparent upon reading the following detailed description along with the accompanying drawings.

DESCRIPTION OF THE PREFERRED EMBODIMENTS

Figure 1:
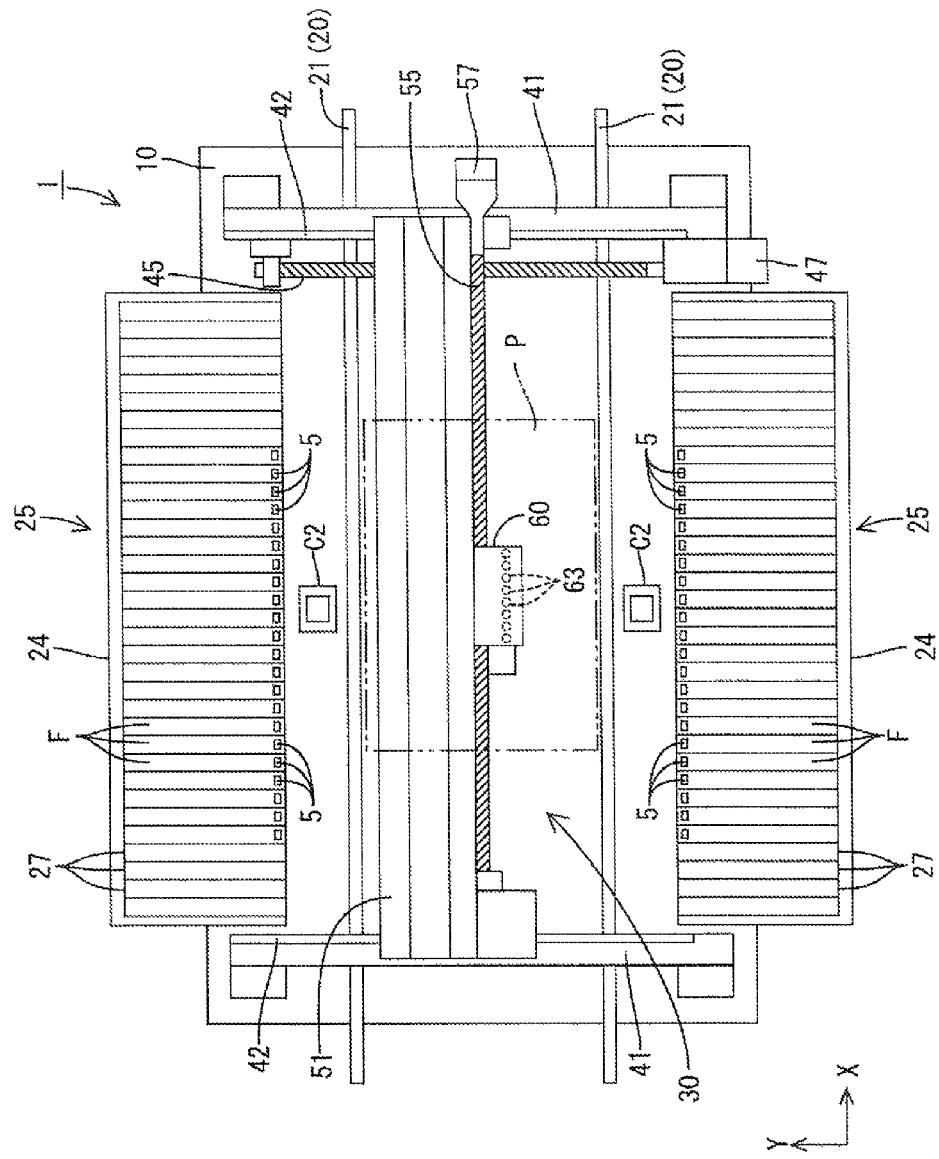
FIG. 1 is a plan view of a surface mounting apparatus according to an embodiment of the present invention.

Hereinafter, an embodiment is described with reference to the drawings. As shown in FIG. 1, a surface mounting apparatus 1 is configured such that various devices are arranged on a base 10 having a rectangular plan view and a flat upper surface. Note that, in the following description, a longer side direction (lateral direction of FIG. 1) of the base 10 is an X-axis direction, a shorter side direction (vertical direction of FIG. 1) of the base 10 is a Y-axis direction and a vertical direction (vertical direction of FIG. 2) of the base 10 is a Z-axis direction.

A transport conveyor (an example of a transport device) 20 for conveying printed circuit boards is arranged in a central part of the base 10. The transport conveyor 20 includes a pair of conveyor belts 21 which are driven in the X-axis direction in a circulating manner. A printed circuit board (an example of a board) P is set to bridge over the both conveyor belts 21. The printed circuit board P placed on the upper surfaces of the conveyor belts 21 is fed in a driving direction (X-axis direction) of the conveyor belts 21 due to friction between the printed circuit board P and the conveyor belts 21.

In the surface mounting apparatus 1, the right side shown in FIG. 1 serves as an entrance and the printed circuit board P is carried into the apparatus through the transport conveyor 20 from the right side shown in FIG. 1. The printed circuit board P carried into the apparatus is conveyed to an operation position (position shown by chain double-dashed line of FIG. 1) in the center of the base 10 by the transport conveyor 20 and stopped there.

Component feeding devices 25 for feeding electronic components 5 to be mounted on the printed circuit board P are provided at two positions around the operation position (sides lateral to a conveying direction of the printed circuit board P). Each of these component feeding devices 25 includes a feeder attachment table 24. A plurality of attaching portions 27 are provided on this feeder attachment table 24. Feeders F are attached one after another in the lateral direction on most of the plurality of attaching portions 27.

At the operation position, an operation of mounting the electronic components 5 fed by the feeders F on the printed circuit board P is performed by a component mounting device 30. The printed circuit board P finished with a mounting process is conveyed in a leftward direction of FIG. 1 by the transport conveyor 20 and carried out of the apparatus.

The component mounting device 30 includes an X-axis servo mechanism, a Y-axis servo mechanism, a Z-axis servo mechanism, suction heads 64 which are moved in the X-axis, the Y-axis direction and the Z-axis direction by being driven by these respective servo mechanisms, and the like.

Specifically, as shown in FIG. 1, a pair of supporting legs 41 are installed on the base 10. The both supporting legs 41 are located on opposite sides of the operation position in the X-axis direction and extend straight along the Y-axis direction. A guide rail 42 extending in the Y-axis direction is installed along the Y-axis direction on the upper surface of each of the both supporting legs 41. A head supporting body 51 extending in the X-axis direction is attached to the respective guide rails 42 installed on opposite sides of the base 10 in the X-axis direction in a state where opposite end parts of the head supporting body 51 in its longer side direction are connected.

A Y-axis ball screw 45 extending in the Y-axis direction is mounted on one (right one in FIG. 1) supporting leg 41. An unillustrated ball nut is threadably engaged with this Y-axis ball screw 45. Further, a Y-axis motor 47 is attached to the Y-axis ball screw 45.

When the Y-axis motor 47 is energized, the ball nut moves back and forth along the Y-axis ball screw 45, with the result that the head supporting body 51 fixed to the ball nut and a head unit 60 to be described later move in the Y-axis direction along the guide rail 42 (Y-axis servo mechanism).

Figure 2:
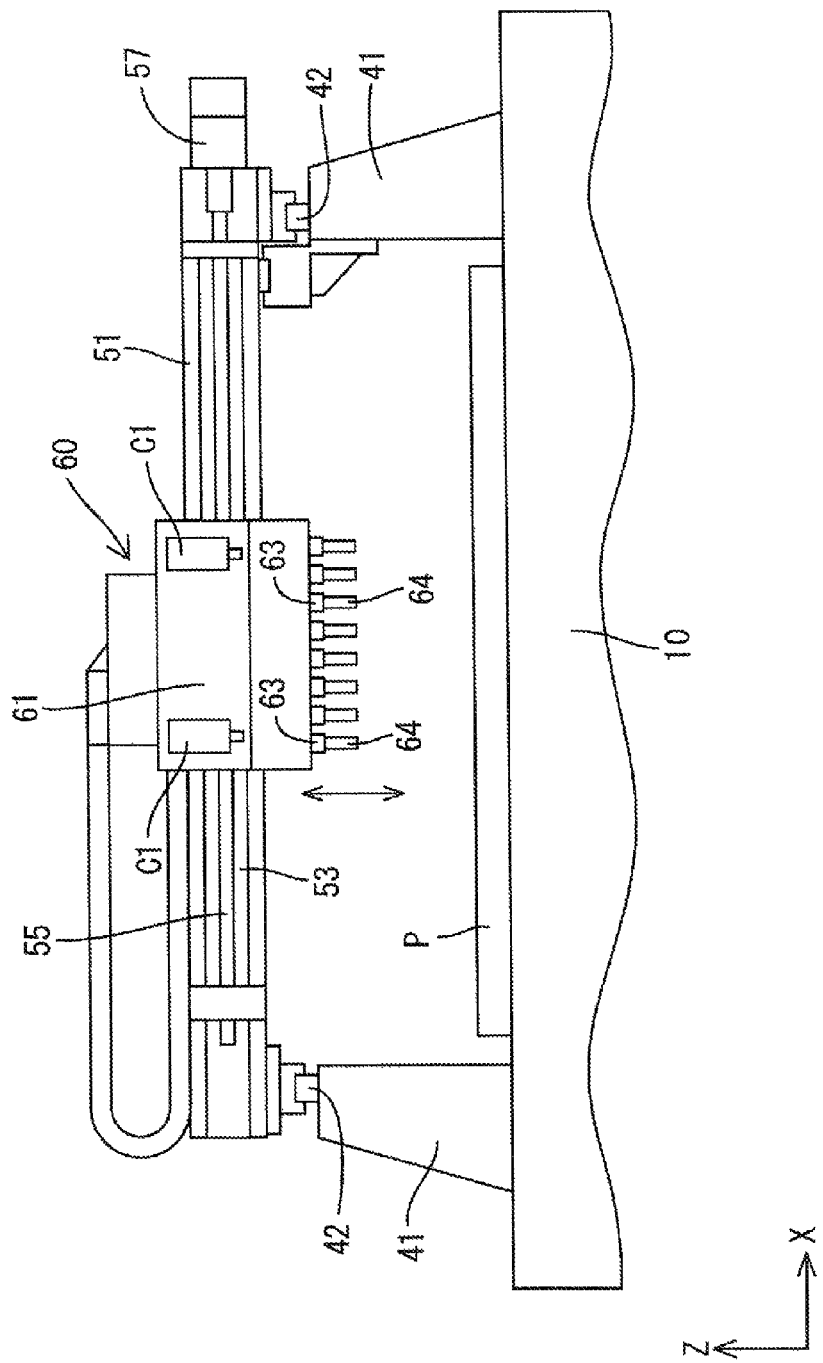
FIG. 2 is a partial enlarged view showing a supporting structure of a head unit.

As shown in FIG. 2, a guide member 53 extending along the X-axis direction is installed on the head supporting body 51. The head unit 60 movable along an axial direction of the guide member 53 is attached to the guide member 53. Further, an X-axis ball screw 55 extending along the X-axis direction is mounted on the head supporting body 51. An unillustrated ball nut is threadably engaged with this X-axis ball screw 55.

An X-axis motor 57 is attached to the X-axis ball screw 55. When this X-axis motor 57 is energized, the ball nut moves back and forth along the X-axis ball screw 55, with the result that the head unit 60 fixed to the ball nut moves in the X-axis direction along the guide member 53 (X-axis servo mechanism).

By controlling the X-axis servo mechanism and the Y-axis servo mechanism in a comprehensive manner as described above, the head unit 60 can be moved in a horizontal direction (X-Y plane direction) on the base 10.

A plurality of mounting heads 63 for performing the mounting operation are installed in a row on this head unit 60. The mounting heads 63 project downward from the lower surface of the head unit 60 and suction nozzles 64 are provided on the tips of the mounting heads 63.

Each mounting head 63 is rotatable about an axis by being driven by an R-axis motor. Further, each mounting head 63 is movable upward and downward relative to a frame 61 of the head unit 60 by being driven by a Z-axis motor (Z-axis servo mechanism). A negative pressure is supplied form an unillustrated suction device to each suction nozzle 64, thereby generating a suction force at the tip of the suction nozzle 64.

By having the above configuration, the surface mounting apparatus 1 operates the respective servo mechanisms at predetermined timings and the mounting heads 63 take out the electronic components 5 fed through the feeders F at component feeding positions A on the feeders F (see FIG. 4) and mount them on the printed circuit board P.

Note that reference sign C2 in FIG. 1 denotes a component recognition camera and reference sign C1 in FIG. 2 denotes a board recognition camera. The component recognition camera C2 detects sucked postures of the electronic components 5 by picking up images of the electronic components 5 taken out by the mounting heads 63. The board recognition camera C1 is fixed to the head unit 60 with an imaging surface faced down and integrally moves with the head unit 60. By driving the X-axis servo mechanism and the Y-axis servo mechanism described above in this way, an image at any arbitrary position on the printed circuit board P at the operation position can be picked up by the board recognition camera C1.

In the case of sucking the electronic components 5 by the suction nozzles 64 in the mounting operation on the printed circuit board P, the mounting operation takes time if the electronic components 5 are sucked from the feeders F attached at various positions of the component feeding device 25. For example, if two feeders F holding the electronic components 5 to be mounted are spaced apart, it takes time to move the mounting heads 63 (suction nozzles 64) along the X-axis direction. Thus, a distance between the respective feeders F holding the respective electronic components 5 to be mounted on the printed circuit board P is preferably as short as possible.

Accordingly, in this embodiment, the respective feeders F used in the mounting operation on the printed circuit board P are attached to the feeder attachment table 24 in a closely spaced state so as to maximally reduce movements of the suction nozzles 64 during the operation of mounting the respective electronic components 5 and enable a plurality of electronic components 5 to be simultaneously sucked in one suction operation by the suction nozzles 64. Note that, in this embodiment, an area of the attaching portions 27, to which the respective feeders F planned to be used in the mounting operation on the printed circuit board P in one production process are attached, out of the plurality of attaching portions 27 provided on the feeder attachment table 24 is an optimized area (an example of a first area) OE (see FIG. 6) and areas of the other attaching portions 27 are non-optimized areas (an example of a second area) NOE (see FIG. 6).

Figure 3:
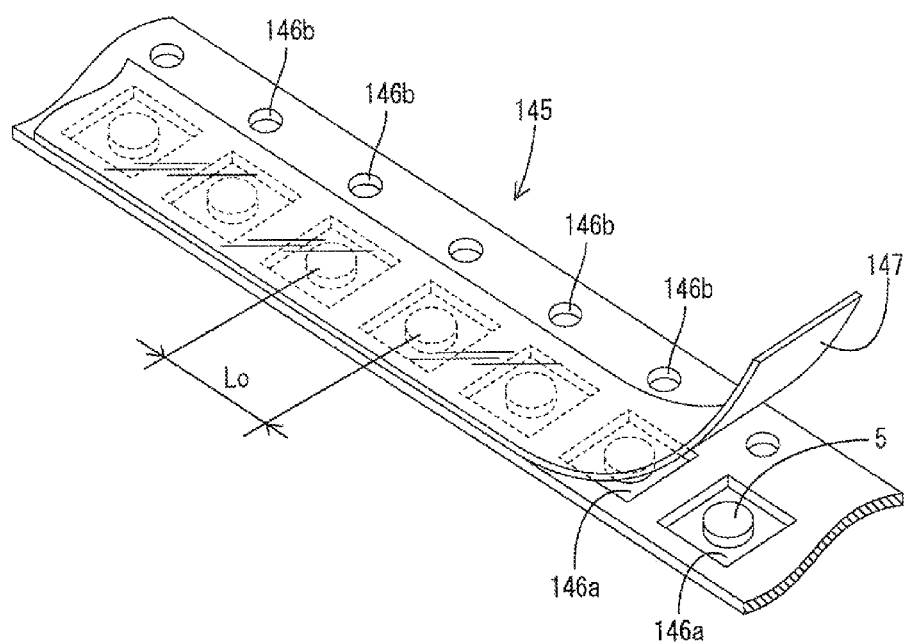
FIG. 3 is a perspective view of a component feeding tape.

Next, the configuration of each feeder F attached to the component feeding device 25 is described. Each feeder F includes a component feeding tape 145 which functions as a carrier for holding a plurality of electronic components 5 as shown in FIG. 3. The component feeding tape 145 is in the form of a sheet long in one direction and includes component accommodating portions 146a in the form of cavities open upward at predetermined intervals (feed pitch of the electronic components 5) L0. Vertically penetrating engaging holes 146b are provided at predetermined intervals on one side of the component feeding tape 145. The electronic components 5 such as IC chips are accommodated one by one in the respective component accommodating portions 146a. A cover tape 147 is attached to the upper surfaces of the respective component accommodating portions 146a to close the component accommodating portions 146a.

Figure 4:
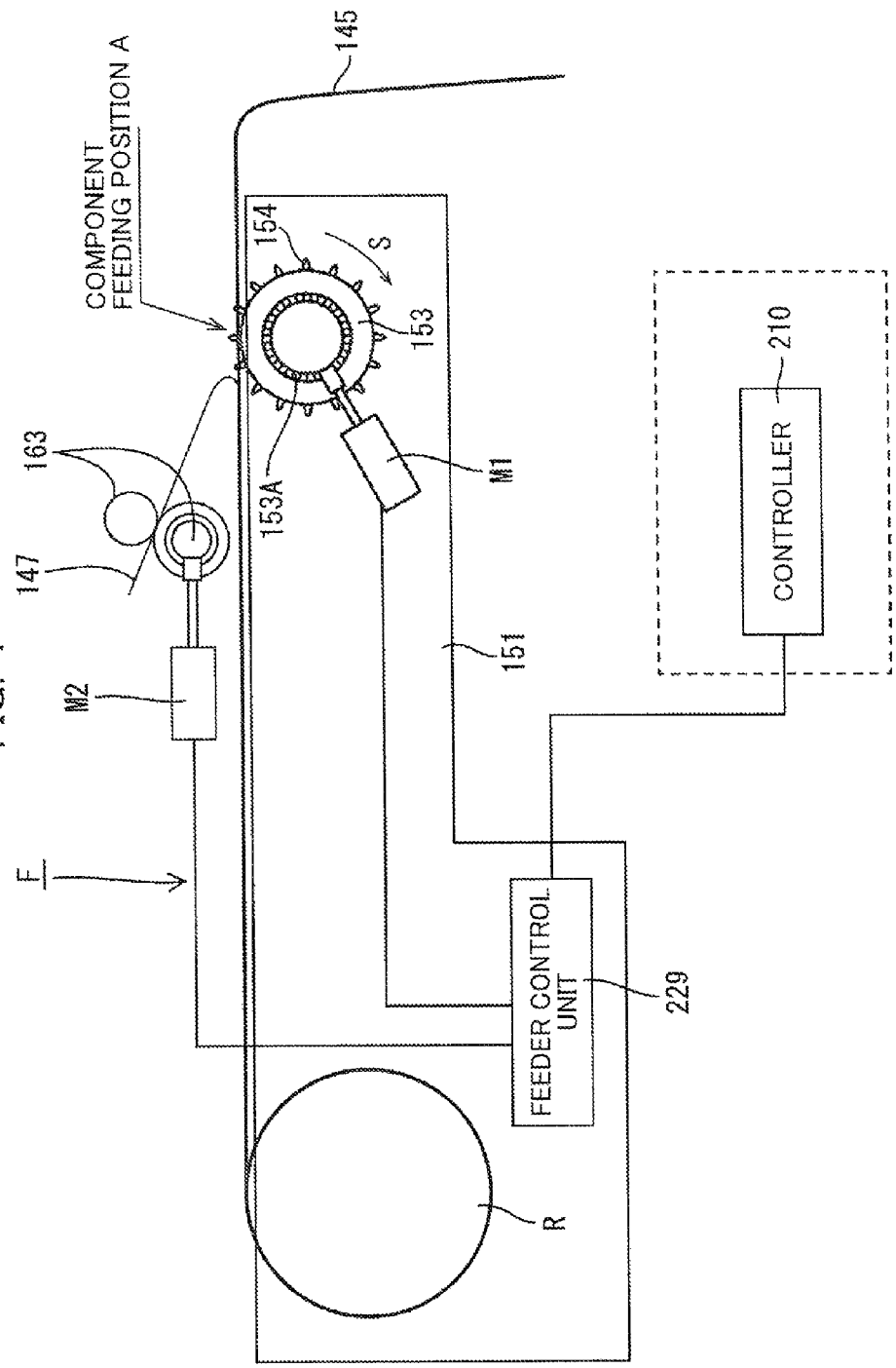
FIG. 4 is a side view showing the configuration of a main body of a feeder.

As shown in FIG. 4, the feeder F includes a sprocket 153, a drive shaft motor M1 for driving and rotating the sprocket 153, a take-up roller 163 for taking up the cover tape 147, a take-up shaft motor M2 for driving and rotating the take-up roller 163, and a base unit 151 in which these respective components are mounted. The base unit 151 is shaped to be long in forward and backward directions, and a reel R on which the component feeding tape 145 is wound is fixed in a rear side of the base unit 151. An upper surface portion of the base unit 151 serves as a tape path for the component feeding tape 145 pulled out from the reel R.

The sprocket 153 is rotatably mounted in a front part of the base unit 151. A drive gear 153A is integrally formed on a side surface of the sprocket 153. A motor gear of the drive shaft motor M1 is engaged with the drive gear 153A. Locking teeth 154 are provided at equal intervals on the outer circumferential surface of the sprocket 153 and engaged with the engaging holes 146b of the component feeding tape 145. Thus, when the drive shaft motor M1 is energized, the sprocket 153 rotates in a forward direction (direction S shown in FIG. 4) and the component feeding tape 145 is conveyed toward the component feeding position A set on the front of the feeder F. Specifically, the feeder F is fed at the feed pitch L0 of the electronic components 5.

The cover tape 147 is peeled off backward from the component feeding tape 145 before the component feeding position A and taken up on the take-up roller 163. After the cover tape 147 is peeled off, the electronic component 5 accommodated in the component accommodating portion 146a is exposed, wherefore the electronic component 5 can be taken out by the mounting head 63 at the component feeding position A. An empty part of the component feeding tape 145 from which the electronic component 5 is taken out is guided to a front lower part of the feeder F through a chute (not shown) provided in the component feeding device 25. Note that the drive of the drive shaft motor M1 and the take-up shaft motor M2 is controlled by a feeder control unit 229 electrically connected to the both motors M1, M2.

Figure 5:
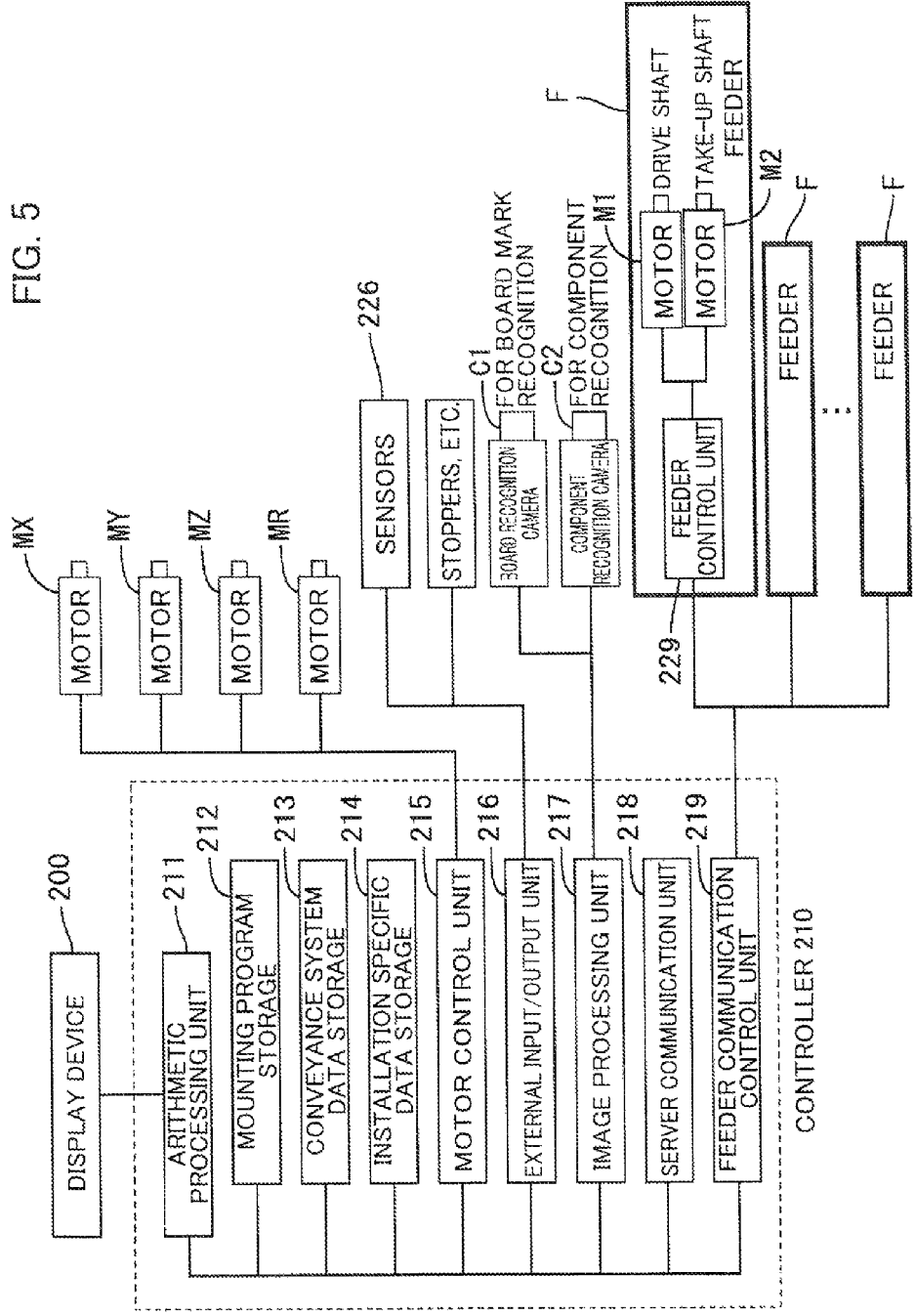
FIG. 5 is a block diagram showing the electrical configuration of a main body of the surface mounting apparatus.

Next, the electrical configuration of the surface mounting apparatus 1 is described with reference to FIG. 5. The surface mounting apparatus 1 includes a controller (an example of a control device) 210 and is entirely controlled by this controller 210. The controller 210 includes an arithmetic processing unit 211 configured by a CPU or the like. A mounting program storage (an example of a first storage, a second storage) 212, a conveyance system data storage 213, an installation specific data storage 214, a motor control unit 215, an external input/output unit 216, an image processing unit 217, a server communication unit 218, a feeder communication control unit 219 and a display device 200 are electrically connected to the arithmetic processing unit 211.

A mounting program for controlling a servo mechanism composed of various motors and the like to be described later is stored in the mounting program storage 212. Further, related information relating to the types and the remaining numbers of the electronic components 5 respectively held by a plurality of feeders attached to the component feeding devices 25 and component information including the number of printed circuit boards P to be produced and the types and used numbers of the electronic components 5 to be mounted on the printed circuit boards P are respectively stored in the mounting program storage 212. Furthermore, a mounting program optimized to use the respective feeders F attached in the optimized area OE of the feeder attachment table 24 unless the electronic components 5 run out in the mounting operation of the electronic components 5 in one production process based on the above related information and component information is stored in advance in the mounting program storage 212.

Data for controlling a conveyance system such as the transport conveyor 20 are stored in the conveyance system data storage 213. Specific data (e.g. upward and downward movements of the suction nozzles 64, etc.) are stored for each installation of the component mounting device 30 in the installation specific data storage 214. The motor control unit 215 is for driving a motor MX for driving in the X-axis, a motor MY for driving in the Y-axis, a motor MZ for driving in the Z-axis and a motor MR for driving in an R-axis in accordance with the mounting program together with the arithmetic processing unit 211. The above various motors are electrically connected to this motor control unit 215.

The external input/output unit 216 is a so-called interface and receives detection signals output from various sensors 226 provided in a main body of the surface mounting apparatus 1 in addition to transmitting and receiving control signals to and from the feeders F.

The board recognition cameras C1 and the component recognition cameras C2 are electrically connected to the image processing unit 217, which receives image signals output from these respective cameras C1, C2. In the image processing unit 217, component images and board images are respectively analyzed based on the received image signals.

The feeder communication control unit 219 generally controls the respective feeders F by being electrically connected to the feeder control units 229 of the respective feeders F attached to the component feeding devices 25. The display device 200 is electrically connected to the arithmetic processing unit 211. Various pieces of information notified from the arithmetic processing unit 211 are displayed on the display device 200.

Next, managements on the remaining numbers of the electronic components 5 held by the respective feeders F and the attachment and removal of the feeders F are described. During the operation of mounting various electronic components 5 on the printed circuit boards P, the arithmetic processing unit 211 manages the remaining numbers of the electronic components 5 held by the respective feeders F based on the above related information and component information stored in the mounting program storage 212. When detecting the feeder F (first feeder) holding the electronic components 5 (first electronic components) whose remaining number is smaller than that of the printed circuit boards P, the arithmetic processing unit 211 notifies the position of the attaching portion 27, to which the feeder F (first feeder) holding an insufficient number of the electronic components 5 out of the plurality attaching portions 27 provided on the feeder attachment table is attached, to the display device 200 and causes the display device 200 to show a display indicating that position information (an example of a first display).

Here, a number corresponding to the type of the held electronic components 5 is assigned to each feeder F. When a new feeder F is attached to any of the attaching portions 27 provided on the feeder attachment table 24, the component feeding device 25 detects which number of the feeder F is attached to which attaching portion 27 and transmits the position information of that attaching portion 27 to the controller 210. Further, when the feeder F is removed from any of the attaching portion 27 provided on the feeder attachment table 24, the component feeding device 25 detects which number of the feeder F is removed from which attaching portion 27 and transmits the position information of that attaching portion 27 to the controller 210. Note that, by assigning the number to each feeder F in this way, the remaining number of the electronic components 5 held by the feeder F can be managed even if the attached position of this feeder F is changed.

In this embodiment, when the feeder F holding an insufficient number of the electronic components 5 is detected by the arithmetic processing unit 211 as described above, the arithmetic processing unit 211 causes the display device 200 to display not only the position information of that feeder F, but also a removal instruction instructing the removal of that feeder F (an example of a second display). Further, the arithmetic processing unit 211 detects another attaching portion 27, to which no feeder F is attached, out of the plurality of attaching portions 27 and causes the display device 200 to show a display designating the position of the other attaching portion 27 (an example of a third display).

As described above, in the surface mounting apparatus 1 according to this embodiment, when the first feeder holding first electronic components 5A whose remaining number is smaller than that of the printed circuit boards P is detected, the display device 200 is caused to show a display indicating the attached position of that first feeder, a display instructing the removal of that first feeder from the attaching portion 27 and a display designating the position of another attaching portion 27 to which the first feeder removed from the attaching portion 27 is to be reattached.

An operator can remove the first feeder holding an insufficient number of first electronic components (removing step) and attach it to another attaching portion 27 (first attaching step) in accordance with the above respective displays on the display device 200. Here, the electronic components 5 other than the first electronic component are mounted on the printed circuit board P by the component mounting device 30 until the operator attaches the first feeder to the other attaching portion 27 after removing it from the attaching portion 27 (first mounting step). Thus, even after the operator removes the first feeder from the attaching portion 27, the mounting of the electronic components 5 on the printed circuit board P is continued. After the operator attaches the first feeder to the other attaching portion 27, the mounting of the first electronic component on the printed circuit board P from that first feeder is resumed (second mounting step). Thus, even if shortage occurs in the first feeder holding the first electronic components, the feed of the electronic components 5 by the component feeding device 25 is continued without being stopped.

Thereafter, the operator can attach a second feeder (e.g. new feeder) sufficiently holding the first electronic components to another attaching portion 27 (e.g. attaching portion to which the first feeder was initially attached) (second attaching step). Even if the operator attaches the second feeder, the mounting of the first electronic components from the first feeder is continued until the remaining number of the electronic components 5 held by the first feeder becomes 0. When the remaining number of the electronic components 5 held by the first feeder becomes 0, the mounting of the first electronic components on the printed circuit boards P is resumed from the second feeder (third mounting step). Thus, even if the shortage of the first electronic components occurs in the first feeder, for example, when the operator is absent, the feed of the first electronic components is continued from the second feeder. As a result of these, in the surface mounting apparatus 1 according to this embodiment, the stop of the apparatus due to shortage can be avoided.

Further, in the surface mounting apparatus 1 according to this embodiment, the component feeding device 25 is divided into the optimized area OE and the non-optimized areas NOE. Thus, if the first feeder holding the first electronic components whose remaining number is smaller than that of the printed circuit boards P is detected in the surface mounting apparatus 1, the operator can attach the first feeder attached in the optimized area OE to another attaching portion provided in the non-optimized area NOE in the above first attaching step. Further, the operator can, thereafter, attach the second feeder to the attaching portion 27 provided in the optimized area OE in the second attaching step.

In this way, in the surface mounting apparatus 1, a time during which the first electronic components are mounted from the first feeder can be a short time until the remaining number of the first electronic components held by the first feeder becomes 0 after the first feeder is attached to the other attaching portion 27 provided in the non-optimized area NOE. In times other than that, the first electronic components can be mounted from the first or second feeder attached in the optimized area OE. Thus, a time during which the electronic components 5 are mounted from the feeder F attached in the non-optimized area NOE can be shortened. Specifically, in the surface mounting apparatus 1, a mounting loss caused by the mounting of the electronic components 5 from the feeder F arranged in the non-optimized area NOE can be reduced.

Next, the operation of the surface mounting apparatus 1 according to this embodiment having the above configuration to mount the respective electronic components 5 on the printed circuit boards P in one production process (hereinafter, referred to as 1 suction G (group)) is described with reference to enlarged plan views of FIG. 6 to FIG. 10 and flow charts of FIGS. 11 to 14. Note that, in FIGS. 6 to 10, reference sign F0 denotes the feeder with the first electronic components whose remaining number is 0 (hereinafter, referred to as a zero remaining number feeder), reference sign F1 denotes the feeder with the first electronic components 5 whose remaining number is smaller than that of the printed circuit boards P (hereinafter, referred to as a shortage feeder), reference sign F2 denotes the feeder with the first electronic components whose remaining number is sufficiently larger than that of the printed circuit boards P (hereinafter, referred to as a large remaining number feeder), and reference sign F3 denotes a new feeder holding the first electronic components 5 (hereinafter, referred to as a new feeder). Further, reference sign FN denotes the feeder not used in the production this time (hereinafter, referred to as an unused feeder) and reference sign FE denotes an empty attaching portion 27 to which no feeder is attached (hereinafter, referred to as an empty attaching portion).

Figure 11:
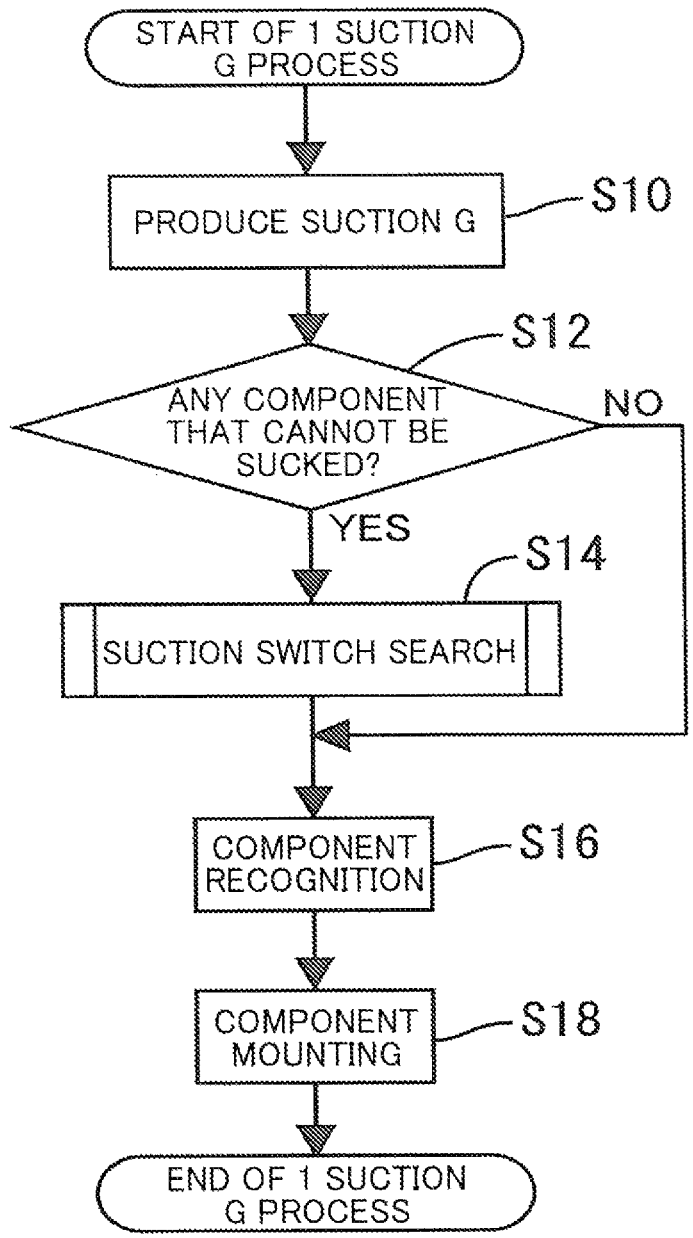
FIG. 11 is a flow chart showing the flow of one suction group process.

First, the flow of a process in the 1 suction G (1 suction G process) is described with reference to FIG. 11. First, a mounting program in the 1 suction G is produced (S10). In this operation, the above optimized mounting program is stored in the mounting program storage 212. The operation of mounting the electronic components 5 on the printed circuit boards P is started in accordance with this mounting program.

Subsequently, in the operation of mounting the electronic components 5 performed in accordance with this mounting program, the controller 210 judges whether or not there is any electronic component 5 that cannot be sucked by the suction nozzle 64 (S12). Specifically, the controller 210 judges whether or not there is any electronic component 5 left on the feeders F corresponding to the positions of the suction nozzles 64. If there is any electronic component 5 that cannot be sucked (YES in S12), the controller 210 performs a suction switch searching process to be described later (S14). If there is no electronic component 5 that cannot be sucked (NO in S12), the controller 210 recognizes the electronic components 5 to be sucked by means of the component recognition camera C2 (S16) and mounts those electronic components 5 on the printed circuit board P (S18). The respective electronic components 5 are mounted on the printed circuit board P by repeating the above flow.

First, a component management process performed in parallel with the 1 suction G process is described. The controller 210 performs the component management process in parallel with the 1 suction G process (see FIG. 13). In the component management process, the controller 210 first judges whether or not there is any feeder (an example of the first feeder; hereinafter, referred to as a shortage feeder F1) holding electronic components (hereinafter, referred to as first electronic components 5A) whose remaining number is smaller than that of the printed circuit boards P out of the electronic components 5 held by the respective feeders F used in the mounting operation based on the above related information and the component information (S60).

Figure 6:
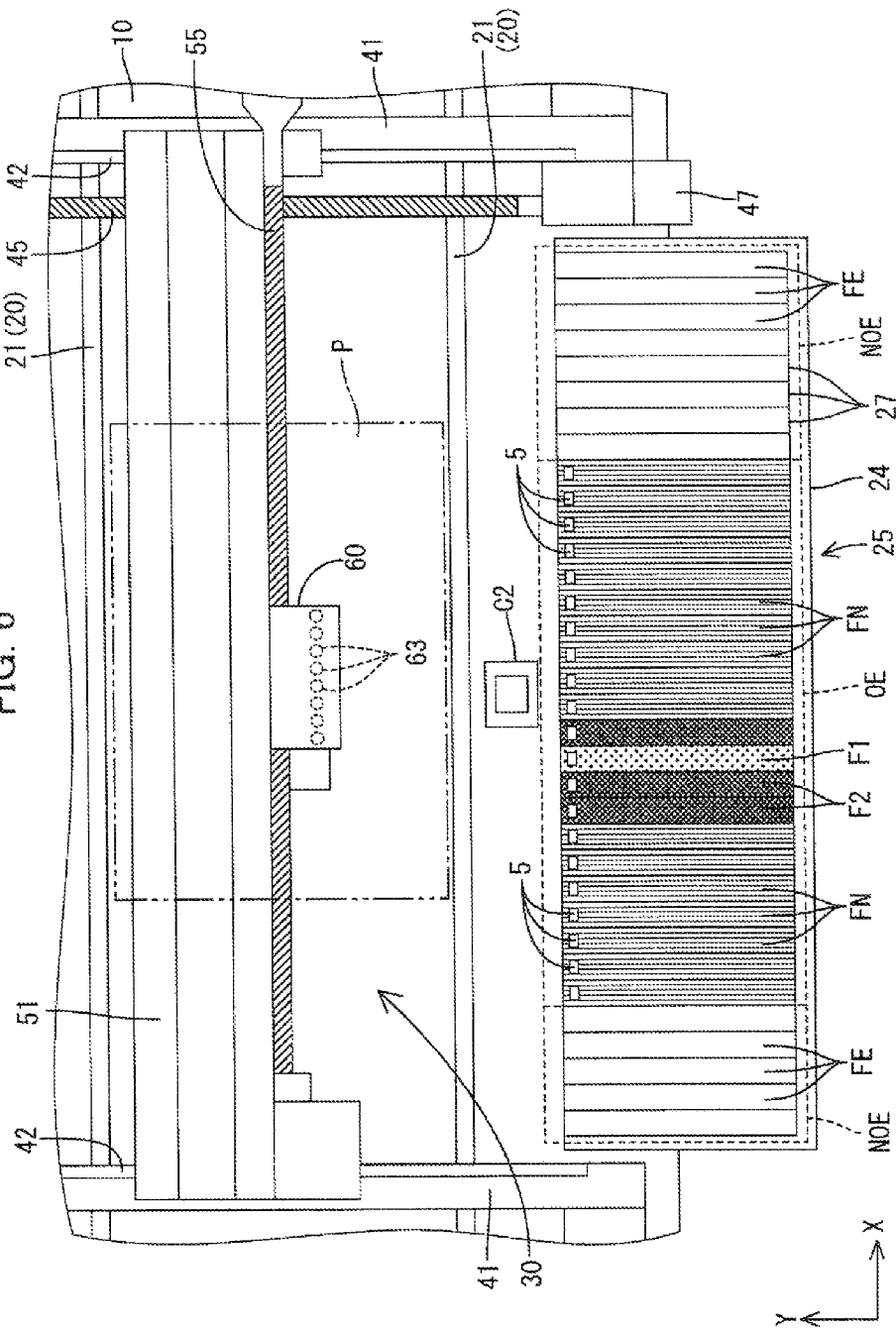
FIG. 6 is an enlarged plan view of the surface mounting apparatus showing an electronic component mounting method (1)
Figure 7:
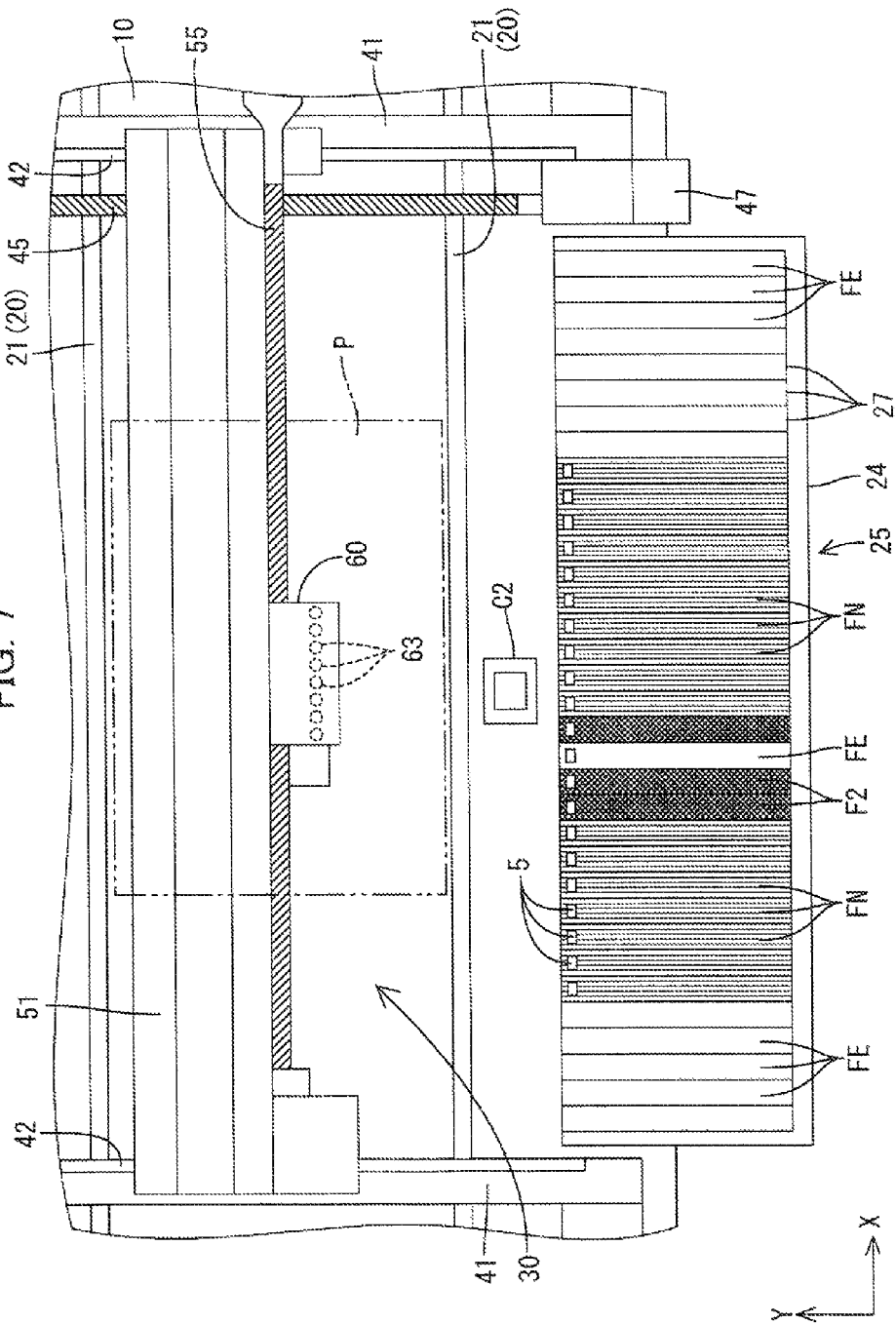
FIG. 7 is an enlarged plan view of the surface mounting apparatus showing an electronic component mounting method (2)

Here, in this embodiment, an example of an arrangement mode of the respective feeders F in the presence of the shortage feeder F1 (YES in S60) is described with reference to FIG. 6. In the arrangement mode of the feeders F shown in FIG. 6, four feeders F used in the 1 suction G mounting operation are attached to the attaching portions 27 provided near the printed circuit board P as a mounting target out of the respective attaching portions 27 provided in the optimized area OE of the feeder attachment table 24. Out of these four feeders F, the three feeders are large remaining number feeders F2 and the remaining one feeder is the shortage feeder F1. Note that, in FIG. 6, the feeders F other than the four feeders F used in the mounting operation out of the feeders F arranged in the optimized area OE of the feeder attachment table 24 are unused feeders FN not used in the 1 suction G mounting operation of this embodiment. Further, the respective attaching portions 27 provided in the non-optimized areas NOE of the feeder attachment table 24 are empty attaching portions FE to which no feeder F is attached.

If the controller 210 detects no shortage feeder F1 in Step S60 (NO in S60), S64 follows. If the controller 210 detects the shortage feeder F1 in S60 (YES in S60), the controller 210 obtains the position information of the attaching portion 27 to which the shortage feeder F1 is attached from the component feeding device 25. Then, Step S64 follows after the controller 210 causes the display device 200 to show each of a display indicating that position information, a display instructing the operator to remove the shortage feeder F1 from the attaching portion 27 and a display designating the position of the attaching portion 27 to which no feeder F is attached and which is provided at a position within the optimized area OE or near the optimized area OE, i.e. a position where the shortage feeder F1 is to be reattached (S62).

In S64, the controller 210 judges whether or not the mounting of all the electronic components 5 that should be mounted on the printed circuit board P has been finished. If the mounting of the electronic components 5 has been finished (NO in S64), the controller 210 finishes the component management process. Unless the mounting of the electronic components 5 has been finished (YES in S64), the controller 210 judges whether or not there is any other electronic component 5 that can be sucked by the suction nozzle 64 (S66). If there is any electronic component 5 that can be sucked (NO in S66), the controller 210 finishes the component management process. Unless there is any electronic component 5 that can be sucked (YES in S66), the controller 210 causes the display device 200 to show an error display (S68) and finishes the component management process.

Subsequently, a feeder removal monitoring process performed in parallel with the 1 suction G process is described. The controller 210 performs the feeder removal management process in parallel with the 1 suction G process (see FIG. 14). In the feeder removal monitoring process, the controller 210 monitors whether or not the feeder F has been removed from each attaching portion 27 of the component feeding device 25 (S80). When receiving information on the removal of the feeder F from any of the attaching portions 27 of the component feeding device 25 from the component feeding device 25 (YES in S80), the controller 210 sets a suction switch trigger thereof to an ON-state (S82). Note that a specification configuration mode for the suction switch trigger is not limited in this embodiment. On the other hand, unless the feeder F has been removed from each attaching portion 27 of the component feeding device 25 (NO in S80), the controller 210 continues to perform the feeder removal monitoring process. This holds true also after the processing of S82 is performed.

Here, if the position of the shortage feeder F1 and the instruction to remove the feeder F are displayed on the display device 200 in the above component management process, the operator can remove the shortage feeder F1 from the attaching portion 27 of the feeder attachment table 24 (an example of the removing step). For example, if the shortage feeder F1 is removed in the state shown in FIG. 6, the attaching portion 27 to which the shortage feeder F1 has been initially attached becomes the empty attaching portion FE (state shown in FIG. 7). By removing the shortage feeder F1 from the attaching portion 27, the suction switch trigger is set to the ON-state in the controller 210.

Figure 12:
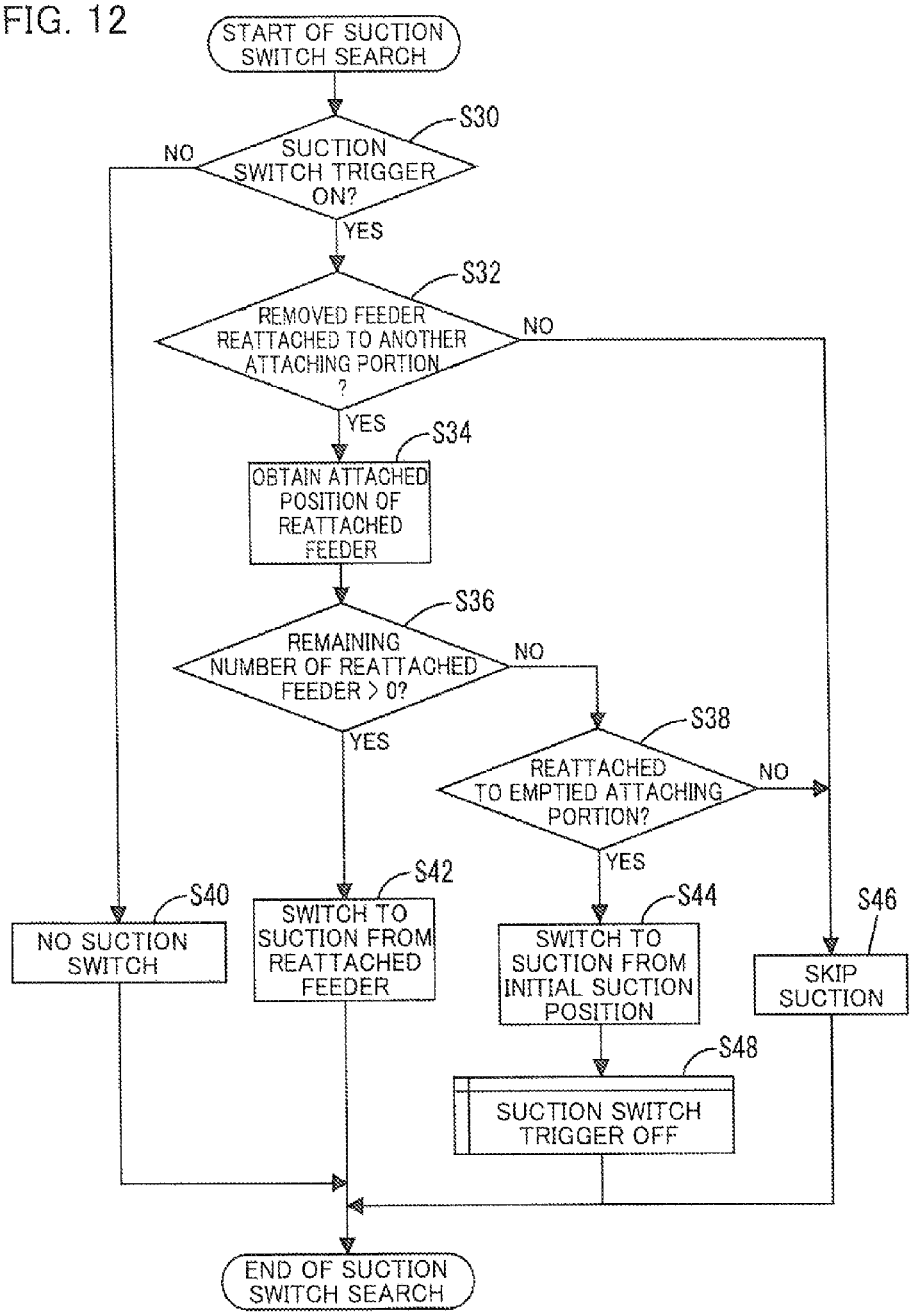
FIG. 12 is a flow chart showing a suction switch searching process.
Figure 13:
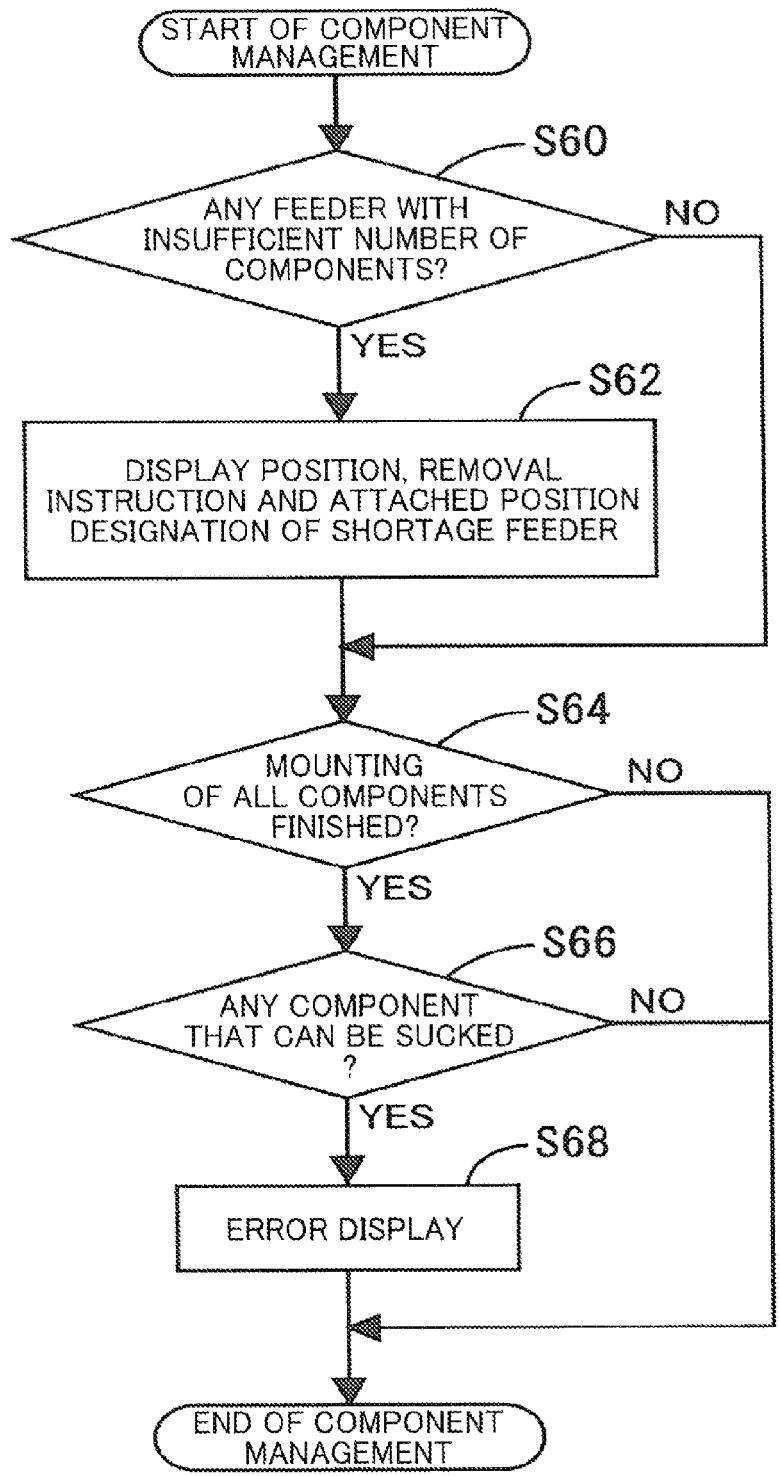
FIG. 13 is a flow chart showing a component management process.
Figure 14:
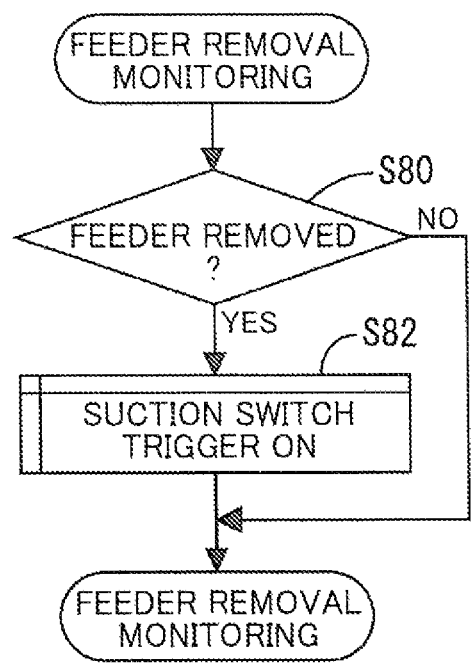
FIG. 14 is a flow chart showing a feeder removal monitoring process.

Next, the suction switch searching process performed by the controller 210 is described based on the flow chart of FIG. 12. In the suction switch searching process, the controller 210 first judges whether or not the suction switch trigger is set in the ON-state, i.e. whether or not any of the feeders used in the mounting operation has been removed from the attaching portion 27 (S30). If judging that the suction switch trigger is not in the ON-state (NO in S30), the controller 210 finishes the suction switch searching process without switching the present suction positions for the electronic components 5 in the mounting operation (S40). If judging that the suction switch trigger is in the ON-state (YES in S30), the controller 210 judges whether or not the feeder F removed from the attaching portion 27 (shortage feeder F1 in this embodiment) has been attached to another attaching portion 27 (S32).

If judging in S32 that the shortage feeder F1 has not been attached to another attaching portion 27 (NO in S32), the controller 210 skips the suction of the first electronic component 5A held by that shortage feeder F1 (S46). Specifically, the controller 210 causes the component mounting device 30 to mount the electronic components 5 other than the electronic component 5A held by the shortage feeder F1, out of various electronic components 5 to be mounted on the printed circuit board P, on the printed circuit board P. Specifically, a mounting sequence of the various electronic components 5 is stored in the mounting program storage 212 and the electronic component 5 stored as the one to be mounted after the first electronic component 5A, the suction of which by the suction nozzle 64 has been skipped, is set as a suction target (an example of the first mounting step). After the processing of S46 is performed, the controller 210 finishes the suction switch searching process.

If judging in S32 that the shortage feeder F1 has been attached to another attaching portion 27 (YES in S32), the controller 210 obtains the position information of the attaching portion 27, to which the shortage feeder F1 has been reattached, from the component feeding device 25 (S34).

Figure 8:
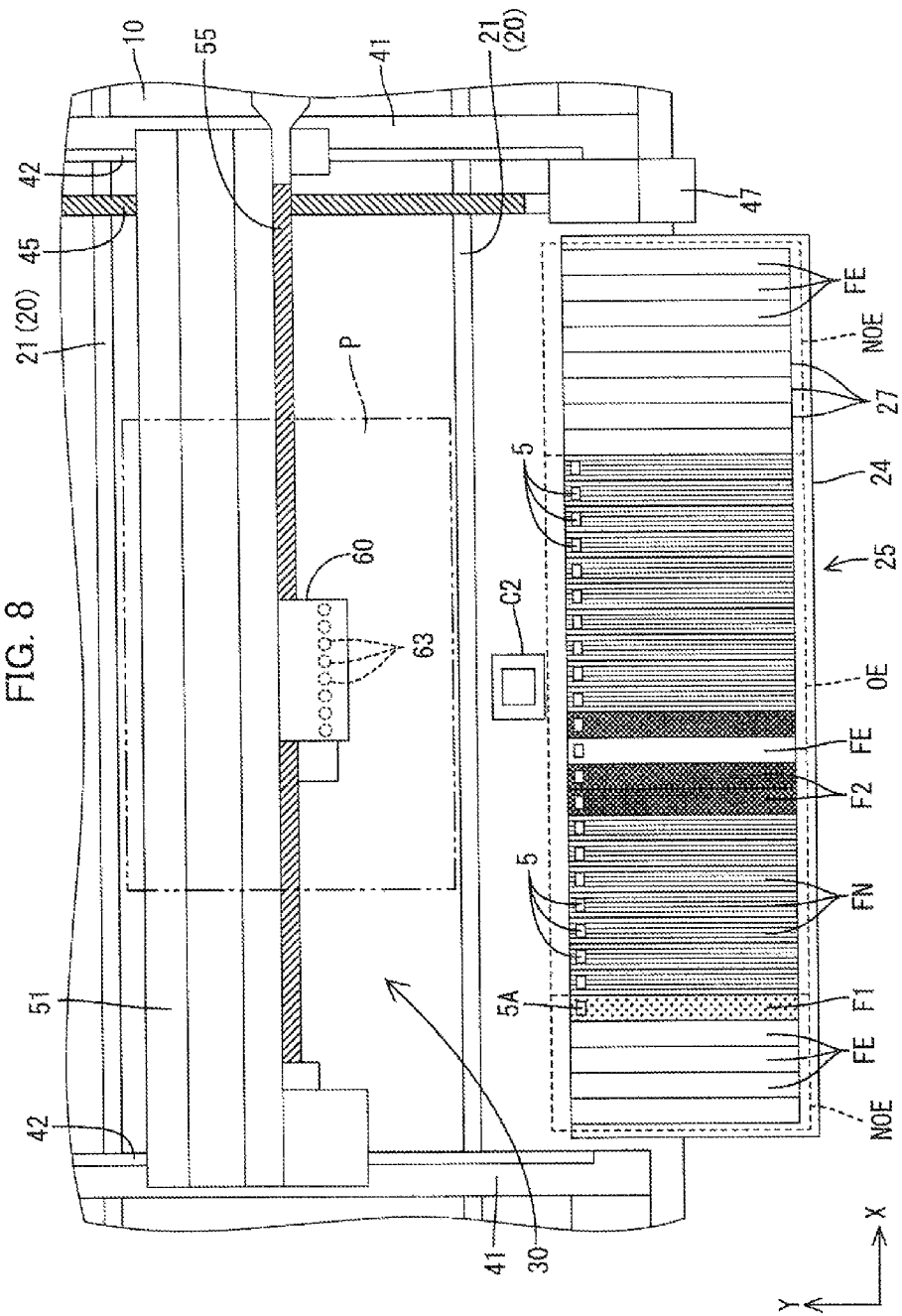
FIG. 8 is an enlarged plan view of the surface mounting apparatus showing an electronic component mounting method (3)

Here, when a display designating the position where the shortage feeder F1 is to be reattached is displayed on the display device 200 in the above component management process, the operator can attach the shortage feeder F1 to another attaching portion 27 of the feeder attachment table 24 in accordance with that display (an example of the first attaching step). For example if the shortage feeder F1 is attached to another attaching portion 27 in the state shown in FIG. 7, the shortage feeder F1 is reattached to the attaching portion 27 located in the non-optimized area NOE out of the respective attaching portions 27 as shown in FIG. 8. FIG. 8 shows a state where the shortage feeder F1 is attached to the attaching portion 27 closest to the optimized area OE out of the respective attaching portions 27 located in the non-optimized areas NOE. Note that, in this embodiment, the respective displays of the position, the removal instruction and the attached position designation of the shortage feeder F1 shown on the display device 200 in S62 are erased by the controller 210 upon the attachment of the shortage feeder F1 to another attaching portion 27.

After the processing of S34 is finished, the controller 210 judges whether or not the remaining number of the first electronic components 5A held by the reattached shortage feeder F1 is larger than 0 (S36). If judging that the remaining number of the first electronic components 5A is larger than 0 (YES in S36), the controller 210 switches the suction position of the suction nozzle 64 to the position of the other attaching portion 27, to which the shortage feeder F1 has been reattached, to mount the first electronic component 5 from the reattached shortage feeder F1 (S42) and finishes the suction switch searching process. After the processing of S42 is finished, the mounting operation of the first electronic component 5A is resumed from the shortage feeder F1 attached to the other attaching portion 27 (an example of the second mounting step).

Figure 9:
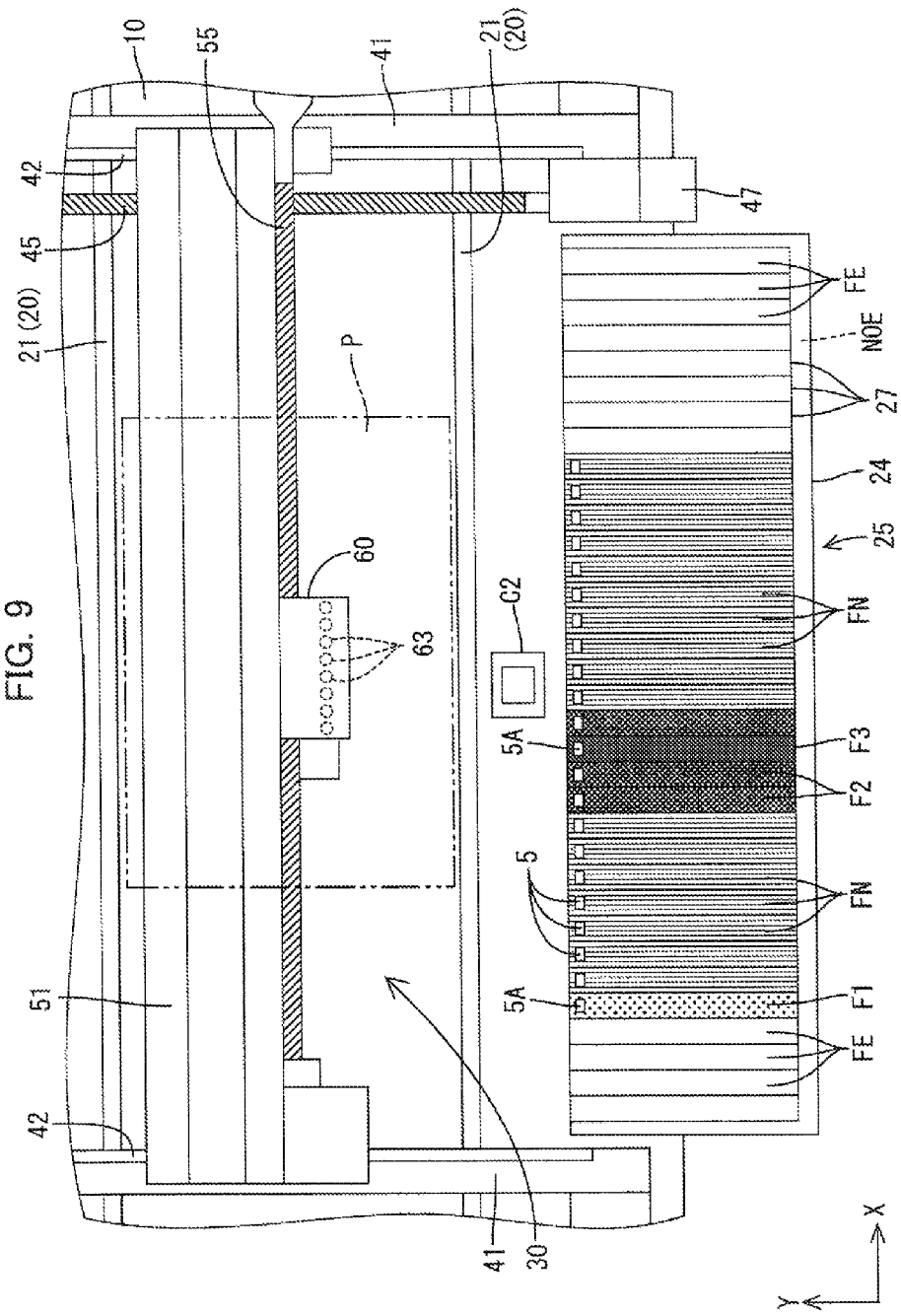
FIG. 9 is an enlarged plan view of the surface mounting apparatus showing an electronic component mounting method (4)
Figure 10:
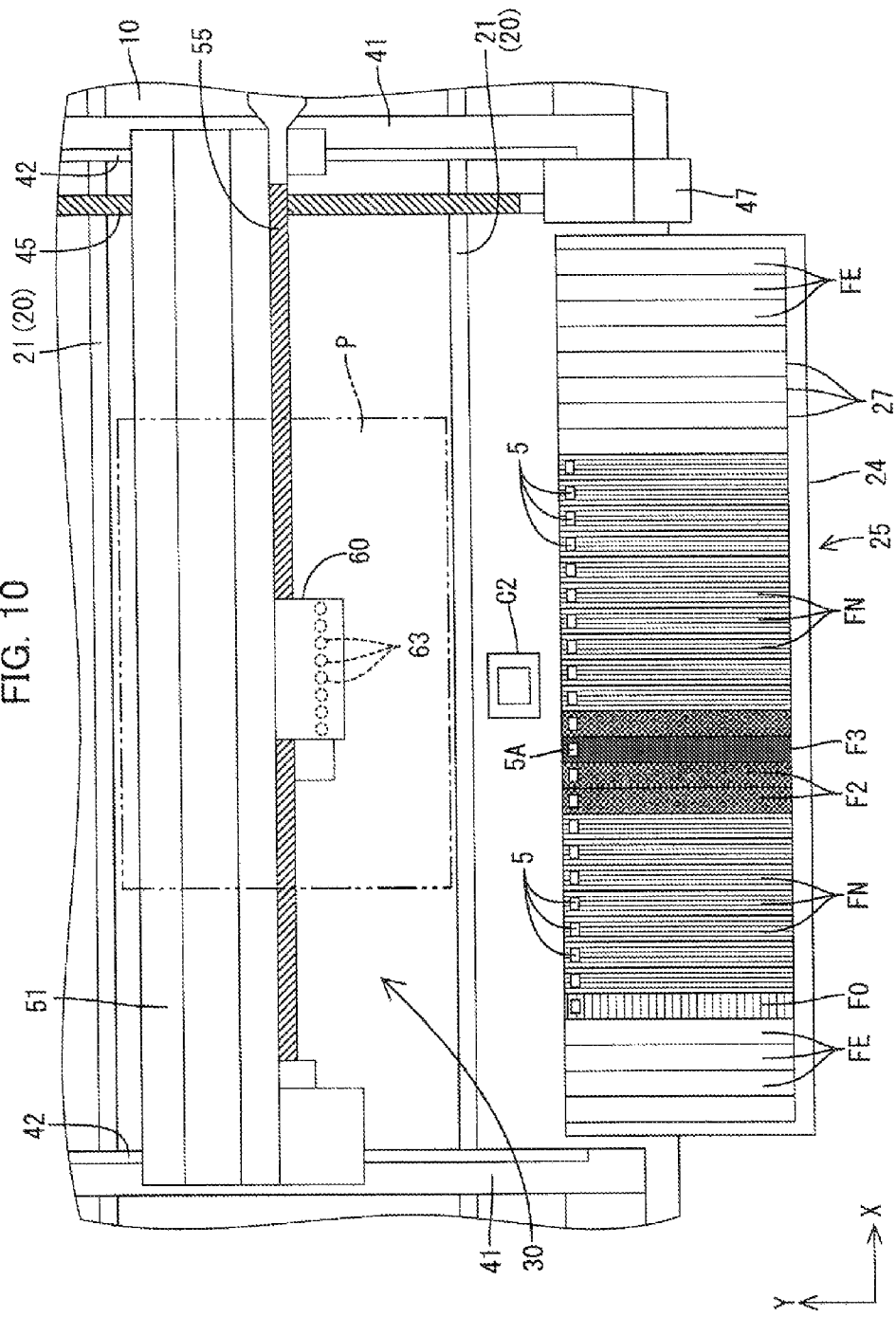
FIG. 10 is an enlarged plan view of the surface mounting apparatus showing an electronic component mounting method (5)

If judging in S36 that the remaining number of the first electronic components 5A is 0 (NO in S36), the controller 210 judges whether or not a new feeder F3 (an example of the second feeder) holding the first electronic components 5A has been attached to the attaching portion 27 to which the shortage feeder F1 has been initially attached (attaching portion 27 located in the optimized area OE; hereinafter, referred to as an initial attaching portion 27) (S38). Here, in a state where the shortage feeder F1 is removed from the initial attaching portion 27, the operator can attach the new feeder F3 to the initial attaching portion 27 (an example of the second attaching step). Note that if the new feeder F3 holding the first electronic components 5A is attached to the initial attaching portion 27 of the shortage feeder F1 in the state shown in FIG. 8, the new feeder F3 is attached to the attaching portion 27 located in the optimized area OE as shown in FIG. 9. FIG. 10 shows a state where the remaining number of the first electronic components 5A held by the shortage feeder F1 in FIG. 9 becomes 0 and the shortage feeder F1 becomes the zero remaining number feeder F0.

If judging in S38 that no new feeder F3 holding the first electronic components 5A is attached to the initial attaching portion 27 (NO in S38), the controller 210 performs the processing of S46 and finishes the suction switch searching process.

On the other hand, if judging in S38 that the new feeder F3 holding the first electronic components 5A is attached to the initial attaching portion 27 (YES in S38), the controller 210 switches the suction position of the suction nozzle 64 to the position of the initial attaching portion 27 to which the new feeder F3 has been attached (S44), sets the suction switch trigger to an OFF-state (S48) and finishes the suction switch searching process. After the processing of S44 is finished, the mounting operation of the first electronic component 5A is resumed from the new feeder F3 attached to the initial attaching portion 27 (an example of the third mounting step).

As described above, in the mounting method of the electronic components 5 according to this embodiment, the shortage feeder F1 holding the first electronic components 5A whose remaining number is smaller than that of the printed circuit boards P is removed from the attaching portion 27 and the electronic components 5 other than the first electronic component 5A out of the electronic components 5 to be mounted on the printed circuit board P are mounted on the printed circuit board P by the component mounting device 30 in mounting the electronic components 5 on the printed circuit board P. Thus, the mounting of the electronic components 5 on the printed circuit boards P can be continued even after the shortage feeder F1 is removed from the attaching portion 27.

Thereafter, the shortage feeder F1 removed from the attaching portion 27 is attached to another attaching portion 27 to which no feeder F is attached and the first electronic components 5A are mounted on the printed circuit boards P from that shortage feeder F1 by the component mounting device 30. Thus, when the shortage feeder F1 is reattached, the mounting of the first electronic components 5A on the printed circuit boards P can be resumed.

As described above, in the mounting method of this embodiment, the feed of the electronic components 5 by the component feeding device 25 can be continued without being stopped even if the electronic components 5 run out in the shortage feeder F1 holding the first electronic components 5A. Thus, the stop of the surface mounting apparatus 1 due to shortage can be avoided.

Further, in the mounting method of the electronic components 5 according to this embodiment, the new feeder F3 holding the first electronic components 5A is attached to the attaching portion to which no feeder is attached after the shortage feeder F1 is attached to another attaching portion 27. Thereafter, the first electronic components 5A are mounted on the printed circuit boards P from the new feeder F3 by the component mounting device 30 on the condition that the remaining number of the first electronic components 5A held by the shortage feeder F1 becomes 0. Thus, even if the shortage of the first electronic components occurs in the shortage feeder F1, for example, when the operator is absent, the feed of the first electronic components 5A can be continued from the new feeder F3. As a result of this, in the mounting method of the electronic components 5 according to this embodiment, the stop of the surface mounting apparatus 1 due to shortage can be avoided. Further, waste can be eliminated by using the shortage feeder F1 until the remaining number of the first electronic components 5A becomes 0.

Further, in the mounting method of the electronic components 5 according to this embodiment, a time during which the first electronic components 5A are mounted from the shortage feeder F1 is a short time until the remaining number of the first electronic components 5A held by the shortage feeder F1 becomes 0 after the shortage feeder F1 is attached to the attaching portion 27 in the non-optimized area NOE. In times other than that, the first electronic components 5A are mounted from the shortage feeder F1 or the second feeder attached in the optimized area OE. Thus, a time during which the electronic components 5 are mounted from the feeder F attached in the non-optimized area NOE can be shortened. Specifically, in the mounting method, a mounting loss caused by the mounting of the electronic components 5 from the feeder F arranged in the non-optimized area NOE can be reduced.

Other Embodiments

The present invention is not limited to the embodiment described above and shown in the drawings. For example, the following embodiments are also included in the technical scope of the present invention.

(1) In the above embodiment, the example is shown in which the first feeder holding the first electronic components is removed from the initial attaching portion when the remaining number of the first electronic components is smaller than that of the printed circuit boards. The reason for removing the first feeder from the initial attaching portion in the removing step is not limited. For example, the first feeder may be removed from the initial attaching portion and attached to another attaching portion because the remaining number of the first electronic components held by the first feeder has reached the preset value. Further, the first feeder may be removed from the initial attaching portion and attached to another attaching portion because of an approaching timing of switching the type of printed circuit boards, on which the first electronic components are to be mounted, in a production process in which the first electronic components are mounted on a plurality of types of printed circuit boards.

(2) In the above embodiment, the example is shown in which the new feeder is attached to the initial attaching portion after the shortage feeder is removed from the initial attaching portion. The new feeder may be attached not only to the initial attaching portion, but also to the attaching portion provided near the initial attaching portion. Even if the new feeder is attached to the attaching portion other than the initial attaching portion, a time during which the electronic components are mounted from the feeder attached in the non-optimized area can be suppressed if this attaching portion is provided in the optimized area.

(3) In the above embodiment, the example is shown in which the new feeder is attached to the initial attaching portion after the shortage feeder is removed from the initial attaching portion. The feeder to be attached to the initial attaching portion is not limited to the new feeder. The feeder to be attached to the initial attaching portion may be a feeder holding a sufficient number of first electronic components even if it is not a new feeder.

(4) Although the example is shown in which the surface mounting apparatus includes the display device in the above embodiment, the surface mounting apparatus may include no display device. In this case, the controller may cause an external display device (smartphone, etc.) to show the above first, second and third displays, for example, by transmitting a signal to the external display device.

(5) In the above embodiment, the example is shown in which the electronic components are mounted on the printed circuit boards from the component feeding device provided at one side out of the component feeding devices provided at the opposite sides of the transport conveyor. The mounting operation according to the above embodiment may be performed from the respective component feeding devices provided at the opposite sides of the transport conveyor.

(6) Besides the above embodiment, the configuration of the surface mounting apparatus can be appropriately changed.

Although the embodiments of the present invention have been described in detail above, these are merely exemplary and not intended to limit the scope of claims. Techniques described in the scope of claims include various modifications and alterations of the specific examples illustrated above.

Further, technical elements described or shown in this specification or in the drawings are intended to demonstrate technical utility singly or by various combinations, and are not limited to combinations described in claims at the time of filing. Further, techniques described or shown in this specification or in the drawings are intended to simultaneously achieve a plurality of objects and have technical utility by achieving one of these objects.

Note that the specific embodiments described above mainly include inventions having the following configurations.

An electronic component mounting method according to one aspect of the present invention is a method for mounting electronic components using a surface mounting apparatus including a base, a plurality of feeders holding a plurality of electronic components, a component feeding device with a plurality of attaching portions to which the feeders are to be mounted, a transport device for conveying a board onto the base, and a component mounting device for mounting the electronic components on the board conveyed onto the base from the feeders attached to the component feeding device, the electronic component mounting method including:

a removing step of removing a first feeder holding first electronic components, out of the electronic components held by a respective plurality of the feeders attached to the component feeding device, from the attaching portion when there is a reason for removing the first feeder from the attaching portion;

a first mounting step of mounting the electronic components other than the first electronic component, out of the electronic components to be mounted on the board, on the board by the component mounting device when the first feeder is removed from the attaching portion;

a first attaching step of attaching the first feeder to another attaching portion, to which no feeder is attached, after the removing step; and a second mounting step of mounting the first electronic component on the board from the first feeder attached to the other attaching portion by the component mounting device after the first attaching step.

In the electronic component mounting method disclosed in this specification, in mounting the electronic components on the board, the first feeder holding the first electronic components, for which there is a reason for removal, is removed and the electronic components other than the first electronic component out of the electronic components to be mounted on the board are mounted on the board by the component mounting device. Thus, even after the first feeder is removed from the attaching portion, the mounting of the electronic components on boards can be continued without causing any shortage of the first electronic components.

Thereafter, the first feeder removed from the attaching portion is attached to another attaching portion to which no feeder is attached, and the first electronic component is mounted on the board from that first feeder by the component mounting device. Thus, when the first feeder is reattached, the mounting of the first electronic components on boards can be resumed. As described above, in the above mounting method, the feed of the electronic components by the component feeding device can be continued without being stopped even if there is a reason for removing the first feeder holding the first electronic components, wherefore the stop of the surface mounting apparatus due to shortage can be avoided.

In the removing step, the first feeder holding the first electronic components may be removed from the attaching portion when the remaining number of the first electronic components is smaller than that of the boards.

In this electronic component mounting method, the attaching portion to which another feeder holding a sufficient number of first electronic components is to be attached can be ensured by removing the first feeder and attaching it to another attaching portion in advance when the remaining number of the first electronic components is smaller than that of the boards. Thus, the shortage of the first electronic components to be mounted on the boards can be prevented.

The above electronic component mounting method may further include a second attaching step of attaching a second feeder holding the first electronic components to the attaching portion to which no feeder is attached after the first attaching step and a third mounting step of mounting the first electronic components on the boards from the second feeder by the component mounting device after the second attaching step on the condition that the remaining number of the first electronic components held by the first feeder becomes 0.

In this electronic component mounting method, after the first feeder is attached to another attaching portion, the second feeder holding the first electronic components is attached to the attaching portion to which no feeder is attached. Thereafter, the first electronic components are mounted on the boards from the second feeder by the component mounting device on the condition that the remaining number of the first electronic components held by the first feeder becomes 0. Thus, even if the shortage of the first electronic components occurs in the first feeder, for example, when an operator is absent, the feed of the first electronic components can be continued from the second feeder. As a result of this, in the above mounting method, the stop of the surface mounting apparatus due to shortage can be avoided. Further, waste can be eliminated by using the first feeder until the remaining number of the first electronic components becomes 0.

In the case of using the surface mounting apparatus in which the plurality of attaching portions of the component feeding device are divided into a first area and a second area, the first feeder may be removed from the attaching portion provided in the first area in the removing step, the first feeder may be attached to the attaching portion provided in the second area in the first attaching step and the second feeder may be attached to the attaching portion provided in the first area in the second attaching step.

In the above electronic component mounting method, for example, an area (optimized area) calculated in advance to enable the mounting of the respective electronic components in an optimal state (the mounting of the respective electronic components in a short time, etc.) is set as the first area and an area (non-optimized area) which is another area and where the respective electronic components cannot be mounted in an optimal state is set as the second area. Then, in the above mounting method, the first electronic components are mounted from the first feeder attached in the non-optimized area only for a short time until the remaining number of the first electronic components held by the first feeder becomes 0 after the first feeder is attached to the attaching portion in the non-optimized area. In times other than that, the first electronic components are mounted from the first feeder or the second feeder attached in the optimized area. Thus, a time during which the components are mounted from the feeder attached in the non-optimized area can be shortened. Specifically, in the above mounting method, a mounting loss caused by the mounting of the components from the feeder arranged in the non-optimized area can be reduced.

A surface mounting apparatus according to another aspect of the present invention includes:

a base;

a plurality of feeders holding a plurality of electronic components;

a component feeding device with a plurality of attaching portions to which the feeders are to be mounted;

a transport device for conveying a board onto the base;

a component mounting device for mounting the electronic components on the board conveyed onto the base from the feeders attached to the component feeding device;

a control device for controlling the drive of the component mounting device; and a display device;

wherein:

the component feeding device detects the attachment of the feeder and transmits position information of the corresponding attaching portion to the control device when the feeder is attached to the attaching portion of the component feeding device and detects the removal of the feeder and transmits position information of the corresponding attaching portion to the control device when any of the feeder is removed from the attaching portion of the component feeding device;

the control device:

causes the display device to show each of a first display indicating the position of the attaching portion, to which a first feeder holding first electronic components out of the electronic components respectively held by a plurality of the feeders attached to the attaching portions of the component feeding device is attached, out of the plurality of attaching portions, a second display instructing the removal of the first feeder from the attaching portion and a third display designating the position of another attaching portion to which the first feeder removed from the attaching portion is to be reattached when there is a reason for removing the first feeder from the attaching portion, causes the component mounting device to mount the electronic components other than the first electronic component on the board when the removal of the first feeder from the attaching portion is detected by the component feeding device, causes the component mounting device to mount the first electronic component on the board from the first feeder attached to the other attaching portion when the reattachment of the first feeder to the other attaching portion is detected by the component feeding device, and causes the component mounting device to mount the first electronic component on the board from a second feeder holding the first electronic components on the condition that the remaining number of the first electronic components held by the first feeder attached to the other attaching portion becomes 0 when the attachment of the second feeder to the attaching portion is detected by the component feeding device.

According to the surface mounting apparatus disclosed in this specification, when there is a reason for removing the first feeder holding the first electronic components, the display device is caused to show the first display indicating the attached position of the first feeder, the second display instructing the removal of the first feeder from the attaching portion and the third display designating the position of the other attaching portion to which the first feeder removed from the attaching portion is to be reattached when there is a reason for removing the first feeder holding the first electronic components. At this time, an operator can remove the first feeder, for which there is a reason for removal, from the attaching portion and attach it to another attaching portion in accordance with those displays.

Here, the electronic components other than the first electronic components are mounted on the boards by the component mounting device until the operator attaches the first feeder to another attaching portion after removing it from the attaching portion. Thus, even after the operator removes the first feeder from the attaching portion, the mounting of the electronic components on the board is continued without causing shortage. After the operator attaches the first feeder to the other attaching portion, the mounting of the first electronic components on the boards is resumed from that first feeder. Thus, the feed of the electronic components by the component feeding device is continued without being stopped even if there is a reason for removing the first feeder holding the first electronic components.

Thereafter, the operator can attach the second feeder holding a sufficient number of first electronic components (e.g. new feeder) to the attaching portion to which the first feeder was initially attached or the attaching portion near it. As just described, even if the operator attaches the second feeder, the mounting of the first electronic components from the first feeder is continued until the remaining number of the electronic components held by the first feeder becomes 0. When the remaining number of the electronic components held by the first feeder becomes 0, the mounting of the first electronic components on the boards is resumed from the second feeder. Thus, even if the shortage of the first electronic components occurs in the first feeder, for example, when the operator is absent, the feed of the first electronic components is continued from the second feeder. As a result of these, the stop of the above surface mounting apparatus due to shortage can be avoided. Further, waste can be eliminated by using the first feeder until the remaining number of the first electronic components becomes 0.

The control device may include a first storage for storing related information relating the types and remaining numbers of the electronic components respectively held by the plurality of feeders and a second storage for storing component information including the number of the boards to be produced and the types and used numbers of the electronic components to be mounted on the boards, and the first, second and third displays may be respectively shown on the display device when the first feeder holding the first electronic components whose remaining number is smaller than that of the boards is detected based on the related information and the component information.

In the above surface mounting apparatus, the operator can remove the first feeder from the attaching portion and attach it to another attaching portion in advance in accordance with those displays when the first feeder holding the first electronic components whose remaining number is smaller than that of the boards is detected. In this way, the shortage of the first electronic components to be mounted on the boards can be prevented.

In the above surface mounting apparatus, the plurality of attaching portions of the component feeding device may be divided into a first area and a second area located more distant from the board than the first area, the control device may cause the component mounting device to mount the electronic components other than the first electronic component on the board when the removal of the first feeder from the attaching portion provided in the first area is detected by the component feeding device, cause the component mounting device to mount the first electronic component from the first feeder attached to the other attaching portion when the reattachment of the first feeder to the other attaching portion provided in the second area is detected by the component feeding device and cause the component mounting device to mount the first electronic component on the board from the second feeder when the attachment of the second feeder to the attaching portion provided in the first area is detected by the component feeding device.

In the above surface mounting apparatus, for example, an area (optimized area) of the component feeding device calculated in advance to enable the mounting of the respective electronic components in an optimal state (the mounting of the respective electronic components in a short time, etc.) is set as the first area and an area (non-optimized area) which is another area and where the respective electronic components cannot be mounted in an optimal state is set as the second area. Then, when the first feeder holding the first electronic components whose remaining number is smaller than that of the boards is detected in the above surface mounting apparatus, the operator can attach the first feeder attached in the optimized area to another attaching portion provided in the non-optimized area. Further, the operator can, thereafter, attach the second feeder to the attaching portion provided in the optimized area. In this way, in the above surface mounting apparatus, a time during which the first electronic components are mounted from the first feeder can be reduced to a short time until the remaining number of the first electronic components held by the first feeder becomes 0 after the first feeder is attached to the other attaching portion provided in the non-optimized area. In times other than that, the first electronic components can be mounted from the first feeder or the second feeder attached in the optimized area. Thus, a time during which the components are mounted from the feeder attached in the non-optimized area can be shortened. Specifically, in the above surface mounting apparatus, a mounting loss caused by the mounting of the components from the feeder arranged in the non-optimized area can be reduced.

As described above, according to the techniques disclosed in this specification, the stop of the surface mounting apparatus due to shortage can be avoided.

This application is based on Japanese Patent application No. 2012-266190 filed in Japan Patent Office on Dec. 5, 2012, the contents of which are hereby incorporated by reference. Although the present invention has been fully described by way of example with reference to the accompanying drawings, it is to be understood that various changes and modifications will be apparent to those skilled in the art. Therefore, unless otherwise such changes and modifications depart from the scope of the present invention hereinafter defined, they should be construed as being included therein.

What is claimed is:

1. An electronic component mounting method for mounting electronic components using a surface mounting apparatus including a base, a plurality of feeders holding a plurality of electronic components, a component feeding device with a plurality of attaching portions to which the feeders are to be mounted, a transport device for conveying a board onto the base, and a component mounting device for mounting the electronic components on the board conveyed onto the base from the feeders attached to the component feeding device, the electronic component mounting method comprising:
   a removing step of removing a first feeder holding first electronic components, out of the electronic components held by a respective plurality of the feeders attached to the component feeding device, from the attaching portion when there is a reason for removing the first feeder from the attaching portion;
   a first mounting step of mounting the electronic components other than the first electronic component, out of the electronic components to be mounted on the board, on the board by the component mounting device when the first feeder is removed from the attaching portion;
   a first attaching step of attaching the first feeder to another attaching portion, to which no feeder is attached, after the removing step; and
   a second mounting step of mounting the first electronic component on the board from the first feeder attached to the other attaching portion by the component mounting device after the first attaching step.

2. The electronic component mounting method according to claim 1, wherein:
   the first feeder holding the first electronic components is removed from the attaching portion in the removing step when the remaining number of the first electronic components is smaller than that of the boards.

3. The electronic component mounting method according to claim 1, further comprising:
   a second attaching step of attaching a second feeder holding the first electronic components to the attaching portion to which no feeder is attached after the first attaching step; and
   a third mounting step of mounting the first electronic component on the board from the second feeder by the component mounting device after the second attaching step on the condition that the remaining number of the first electronic components held by the first feeder becomes 0.

4. The electronic component mounting method according to claim 3 in the case of using the surface mounting apparatus in which the plurality of attaching portions of the component feeding device are divided into a first area and a second area, wherein:
   the first feeder is removed from the attaching portion provided in the first area in the removing step;
   the first feeder is attached to the attaching portion provided in the second area in the first attaching step; and
   the second feeder is attached to the attaching portion provided in the first area in the second attaching step.

\* \* \* \* \*